(12) United States Patent
Aoki et al.

(10) Patent No.: US 7,469,941 B2
(45) Date of Patent: Dec. 30, 2008

(54) METHOD OF PRODUCING A WIRING BOARD

(75) Inventors: Hideo Aoki, Yokohama (JP); Chiaki Takubo, Tokyo (JP); Naoko Yamaguchi, Yokokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/580,849

(22) Filed: Oct. 16, 2006

(65) Prior Publication Data

US 2007/0029107 A1    Feb. 8, 2007

Related U.S. Application Data

(62) Division of application No. 11/103,462, filed on Apr. 12, 2005, now abandoned.

(30) Foreign Application Priority Data

Apr. 13, 2004  (JP) ............... 2004-118350

(51) Int. Cl.
  *H05K 3/02*    (2006.01)
  *B05D 5/12*    (2006.01)
(52) U.S. Cl. .................. 291/846; 29/847; 427/96.1
(58) Field of Classification Search ............ 29/846, 29/847; 427/96.1
  See application file for complete search history.

(56) References Cited

U.S. PATENT DOCUMENTS

| | | | | |
|---|---|---|---|---|
| 2,443,119 A | * | 6/1948 | Rubin | .................. 430/324 |
| 3,031,344 A | * | 4/1962 | Sher et al. | ................ 428/551 |
| 4,585,319 A | | 4/1986 | Okamoto et al. | |
| 4,588,617 A | | 5/1986 | Oka | |
| 4,696,861 A | | 9/1987 | Tatematsu et al. | |
| 4,740,657 A | * | 4/1988 | Tsukagoshi et al. | ....... 174/88 R |
| 4,897,326 A | | 1/1990 | Marengo | |
| 5,041,183 A | * | 8/1991 | Nakamura et al. | .......... 156/264 |
| 5,065,505 A | * | 11/1991 | Matsubara et al. | ............ 29/830 |
| 5,235,741 A | * | 8/1993 | Mase | .......................... 29/830 |
| 5,328,087 A | * | 7/1994 | Nelson et al. | ................ 228/175 |
| 6,214,508 B1 | * | 4/2001 | Kamada et al. | .......... 430/110.2 |
| 6,440,625 B1 | | 8/2002 | Berlin | |
| 6,524,758 B2 | | 2/2003 | Eberlein | |
| 2001/0046021 A1 | * | 11/2001 | Kozuka et al. | ............. 349/150 |
| 2002/0070515 A1 | | 6/2002 | Barbieri et al. | |
| 2003/0102151 A1 | | 6/2003 | Hirose et al. | |

(Continued)

FOREIGN PATENT DOCUMENTS

JP           07-263841         10/1995

(Continued)

OTHER PUBLICATIONS

Yamaguchi, et al., "New Process of Manufacturing Printed Circuit Boards Using Electrophotography Technology", 2004 ICEP Proceedings, pp. 168-172, (Apr. 2004).

*Primary Examiner*—C. J Arbes
(74) *Attorney, Agent, or Firm*—Finnegan, Henderson, Farabow, Garrett & Dunner, L.L.P.

(57) ABSTRACT

A wiring board comprises a substrate; a resin layer which is selectively formed on one main surface of the substrate and has fine metal particles contained or adhered to its surface; and a conductive metal layer which is formed on the resin layer with the fine metal particles interposed between them.

6 Claims, 7 Drawing Sheets

U.S. PATENT DOCUMENTS

| | | |
|---|---|---|
| 2003/0168254 A1 | 9/2003 | Kariya et al. |
| 2004/0197487 A1 | 10/2004 | Aoki et al. |
| 2004/0219376 A1 | 11/2004 | Maeyama et al. |
| 2005/0053772 A1 | 3/2005 | Aoki et al. |

FOREIGN PATENT DOCUMENTS

| | | |
|---|---|---|
| JP | 08-056077 | 2/1996 |
| JP | 2001-284769 | 10/2001 |

\* cited by examiner

METHOD OF PRODUCING A WIRING BOARD

CROSS REFERENCE TO RELATED APPLICATION

This application is a divisional of Application Ser. No. 11/103,462, filed Apr. 12, 2005 now abandoned, which was based upon and claims the benefit or priority from the prior Japanese Patent Application No. 2004-118350 filed on Apr. 13, 2004. The entire contents of these applications which are incorporated herein by reference in their entirety.

BACKGROUND

1. Field of the Invention

The present invention relates to a wiring board and its production method.

2. Description of the Related Art

Conventionally, a subtractive method has been used extensively as a method of forming a circuit pattern on a substrate which configures a wiring board. According to the subtractive method, a glass epoxy substrate on which a copper foil is previously pasted is coated with a photosensitive resist, openings are formed in the resist by exposing and developing, copper is removed from the openings by etching with acid or the like, and the resist is also removed finally to form a prescribed circuit pattern on the substrate.

But, the subtractive method has disadvantages that it needs exposure masks for development corresponding to individual circuit patterns, requires a large number of steps for coating of a resist, exposing, developing, conductor etching, resist removal and the like to form the circuit patterns, making the process control complex, and requires a very high cost for production of a multilayer wiring board.

Accordingly, the present invention has been made to remedy the above problems and provides a wiring board, which can have a sophisticated conductive circuit pattern formed on a substrate without requiring the preparation of a dedicated mask or complex steps and the conductor layer of the conductive circuit pattern formed satisfactorily, and can be produced in various types in small quantity at a low cost, and a production method of the wiring board.

BRIEF SUMMARY OF THE INVENTION

According to an aspect of the present invention, there is provided a wiring board, comprising a substrate; a resin layer which is selectively formed on one main surface of the substrate and has fine metal particles contained or adhered to its surface; and a conductive metal layer which is formed on the resin layer with the fine metal particles interposed between them.

According to an aspect of the present invention, there is provided a wiring board, comprising a substrate; a first resin layer which is selectively formed on one main surface of the substrate and has fine metal particles contained or adhered to its surface; a conductive first metal layer which is formed on the first resin layer with the fine metal particles interposed between them; a second resin layer which is selectively formed to partly cover the first metal layer; a third resin layer which is selectively formed on part of the surface of the first metal layer and on the second resin layer and has the fine metal particles contained or adhered to its surface; a conductive second metal layer which is formed on part of the surface of the first metal layer and on the third resin layer with the fine metal particles partly interposed between them; and a fourth resin layer which is selectively formed on the second resin layer and the second metal layer.

According to another aspect of the present invention, there is provided a method of producing a wiring board, comprising selectively arranging resin particles, which have a resin as a main component and have fine metal particles contained or adhered to their surfaces, on one main surface of a substrate; fixing the resin particles to one main surface of the substrate; and plating metal on the fixed resin layer with the fine metal particles used as plating nuclei.

BRIEF DESCRIPTION OF THE DRAWINGS

Embodiments of the present invention are described with reference to the drawings, which are provided for illustration only and do not limit the present invention in any respect.

DETAILED DESCRIPTION OF THE INVENTION

Embodiments of the present invention will be described with reference to the drawings.

First Embodiment

Figure 1:
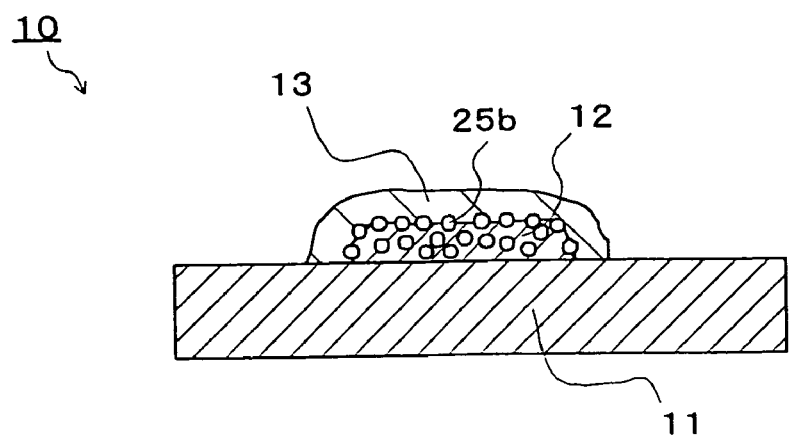
FIG. 1 is a sectional view schematically showing the wiring board according to a first embodiment of the present invention.

FIG. 1 shows schematically a sectional view of a wiring board 10 according to a first embodiment of the present invention.

The wiring board 10 comprises a substrate 11, a nonconductive metal-containing resin layer 12 which is selectively formed on the substrate 11, and a conductive metal layer 13 which is formed on the metal-containing resin layer 12 with fine metal particles 25b interposed between them.

An example of a forming step of the wiring board 10 will be described with reference to FIG. 2 through FIG. 6.

Figure 2:
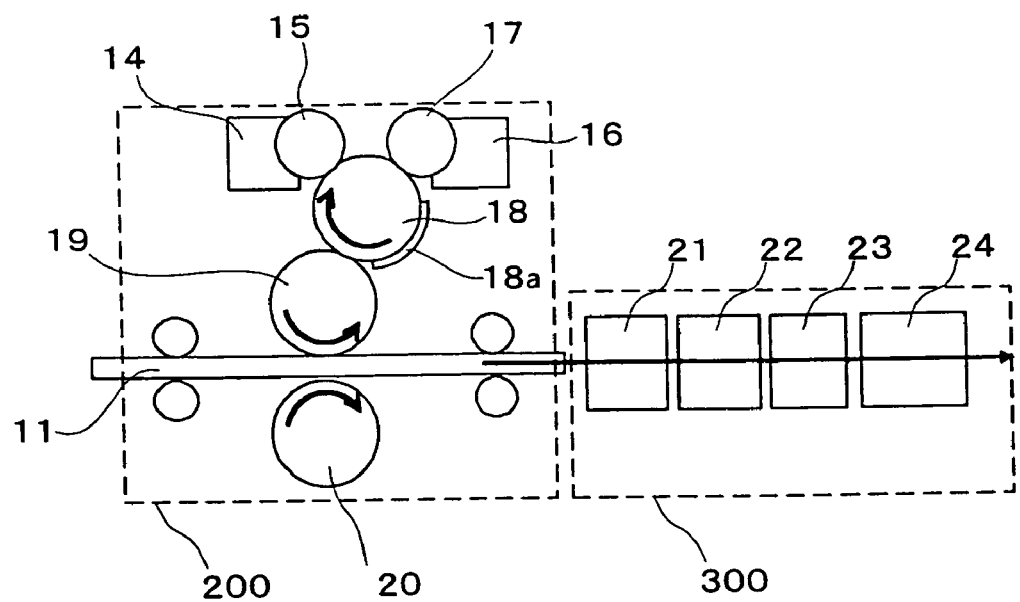
FIG. 2 is a view schematically showing a forming step by the production device of the wiring board according to the first embodiment of the present invention.
Figure 3:
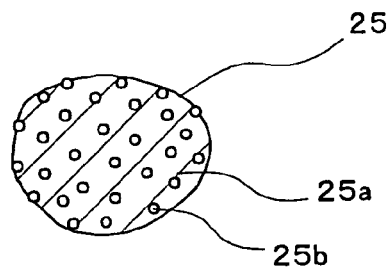
FIG. 3 is a sectional view schematically showing one example structure of a metal-containing resin particle.
Figure 4:
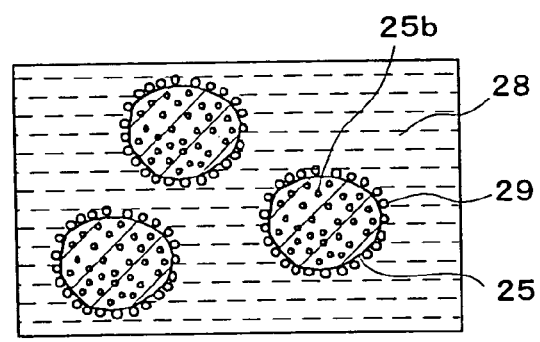
FIG. 4 is a sectional view schematically showing one example structure of a solution in which metal-containing resin particles are dispersed.
Figure 5:
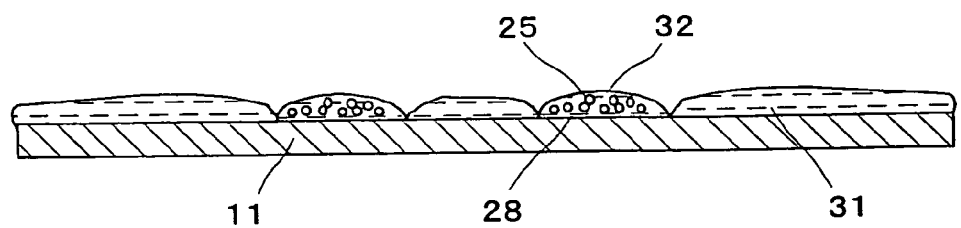
FIG. 5 is a view schematically showing a solution containing water and metal-containing resin particles transferred to a flat plate.

FIG. 2 is a view schematically showing a conductor pattern forming step and device according to the first embodiment of the present invention. FIG. 3 is a view schematically showing a cross section of a metal-containing resin particle 25 which contains fine metal particles 25b which become plating nuclei of a conductor pattern and is used to form a metal-containing resin layer 12. FIG. 4 is a view schematically showing a cross section of a solution which is used in a printing step for selectively transferring the metal-containing resin particles 25 to the substrate 11. FIG. 5 is a view schematically showing a state that a pattern is formed on the substrate 11 in the transferring step. FIG. 6A through FIG. 6D are sectional views schematically showing a process of forming a conductor pattern.

The production device of FIG. 2 for forming a conductor pattern or an insulating pattern is comprised of an offset printing section 200 and a post-treating section 300. The offset printing section 200 is mainly comprised of a water supply device 14, a water supply roller 15, a resin/solution supply device 16, a resin/solution supply roller 17, a plate cylinder 18, a blanket cylinder 19 and an impression cylinder 20. The post-treating section 300 is mainly comprised of a drying device 21, a fixing device 22, an etching device 23, and a plating device 24.

Then, the conductor pattern forming step will be described with reference to FIG. 2 through FIG. 6.

First, the metal-containing resin particles 25 having the fine metal particles 25b contained in a resin 25a as shown in FIG. 3 are produced. The resin which can be used in the present invention is a thermosetting resin or a thermoplastic resin.

For the thermosetting resin, epoxy resin, polyimide resin, phenol resin, bismaleimide resin, cyanate ester resin, bismaleimide-triazine resin, benzicyclobutene resin, polyimide resin, polybenzoxazole resin, butadiene resin, silicone resin, polycarbo-di-imide resin, polyurethane resin and the like are suitable. For the thermoplastic resin, polyphenylene sulfide, polyethylene terephthalate resin, polyethylene resin, polypropylene resin, vinyl chloride resin, polystyrene resin, acrylic resin, polycarbonate resin and the like are suitable. If the reliability of the board is important, the thermosetting resin such as epoxy resin, polyimide resin or the like is preferably used.

For the fine metal particles $25b$, it is desirable to use fine metal particles of at least one element selected from a group consisting of Pt, Pd, Cu, Au, Ni and Ag. These fine metal particles become nuclei for plating at the time of forming a conductor metal layer described later and have an action as a catalyst for the progress of a plating reaction. The metal-containing resin particles 25 contain the fine metal particles $25b$ having a particle diameter of, for example, 1.0 µm or less in a substantially uniformly dispersed state at a ratio of 15 to 85 wt %. Here, if the content of the fine metal particles $25b$ is smaller than 15 wt %, there arises a problem in plating precipitation, and if it is larger than 85 wt %, the resin content becomes small, and adhesiveness between the resin and the substrate is degraded. And, a more preferable content of the fine metal particles $25b$ contained in the metal-containing resin particles 25 is 20 to 70 wt %.

Then, a solution which has the metal-containing resin particles 25 dispersed into a petroleum solvent 28 as shown in FIG. 4 is prepared.

Here, examples of the petroleum solvent 28 include an isoparaffinic solvent, higher fatty ester, silicone oil and the like. The metal-containing resin particles 25 have a particle diameter of about 0.01 to 10 µm, and more preferably 0.1 to 2 µm. The metal-containing resin particles 25 are determined to have a particle diameter in a range of 0.01 to 10 µm because it is hard to control the dispersion if the particle diameter is smaller than 0.01 µm and it is disadvantageous for the miniaturization of the pattern if it is larger than 10 µm.

The content of the metal-containing resin particles 25 in the solvent is 5 to 90 wt %, and preferably 60 to 80 wt %. The content of the metal-containing resin particles 25 in the solvent is determined to 5 to 90 wt % because the printed pattern cannot be assured of having an appropriate thickness or a shape and the adhesiveness of the pattern might become insufficient if the content of the metal-containing resin particles 25 is smaller than 5 wt %, and a problem might arise in printability if it is larger than 90 wt %. A surface-active agent 29 may be added to enhance dispersibility, if necessary.

Then, a flat plate 18a, which is previously provided with a hydrophobic area and a hydrophilic area as latent image of a desired pattern, is disposed on the plate cylinder 18 shown in FIG. 2. When the plate cylinder 18 rotates, water supplied from the water supply device 14 is transferred to the hydrophilic area of the flat plate 18a by the water supply roller 15. Subsequently, the solution containing the metal-containing resin particles 25 supplied from the resin/solution supply device 16 is transferred to the flat plate 18a by the resin/solution supply roller 17.

At that time, the pattern on the flat plate 18a has poor compatibility between the petroleum solvent 28 and water 31 as shown in FIG. 5, so that the water 31 is transferred to the hydrophilic area previously formed on the flat plate 18a, and the solution 32 containing the metal-containing resin particles 25 is transferred to the hydrophobic area to form a desired pattern.

Subsequently, the visible image of the water and the solution transferred to the flat plate 18a is transferred to the blanket cylinder 19 shown in FIG. 2. The blanket cylinder 19 is similar to one which is used for an ordinary offset printing and its surface layer is formed of a rubber-based material. As the rubber-based material, nitrile rubber, silicone rubber, natural rubber and the like can be used.

Then, the substrate 11 to which the pattern is transferred from the blanket cylinder 19 is conveyed to the post-treating section 300, where the water and the solvent are evaporated by the drying device 21, and the resin is fixed to the substrate 11 by the fixing device 22. Furthermore, the fine metal particles contained in the resin are exposed on the surface by the etching device 23, and a plating treatment is performed by the plating device 24 with the exposed fine metal particles used as plating nuclei.

The individual steps by the post-treating section 300 will be described briefly with reference to FIG. 6A through FIG. 6D.

Figure 6A:
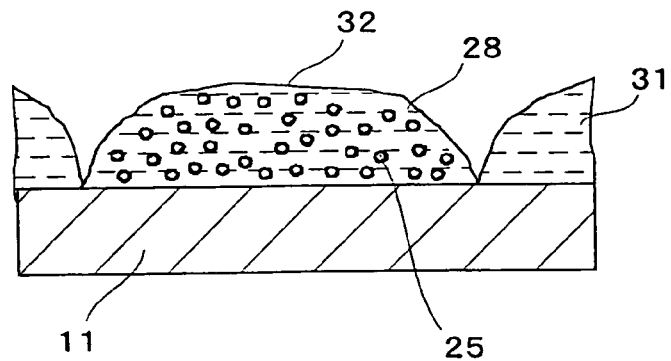
FIG. 6A is a sectional view schematically showing a step of forming a conductor pattern.

First, the layer of the solution 32 and the water 31 is formed on the substrate 11 which is conveyed from the offset printing section 200 to the post-treating section 300 as shown in FIG. 6A. In the solution 32, the metal-containing resin particles 25 mainly containing the fine metal particles are dispersed in the solvent 28.

Figure 6B:
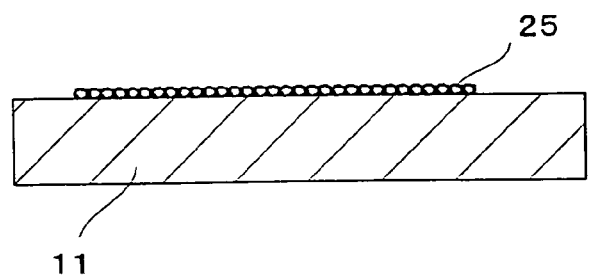
FIG. 6B is a sectional view schematically showing a step of forming the conductor pattern.

A drying step is conducted by the drying device 21 to evaporate the water and the solvent by heating, and only the metal-containing resin particles 25 containing the fine metal particles remain on the substrate 11 as shown in FIG. 6B. A heating temperature is about 120° C. when water and an isoparaffine solvent are used.

Figure 6C:
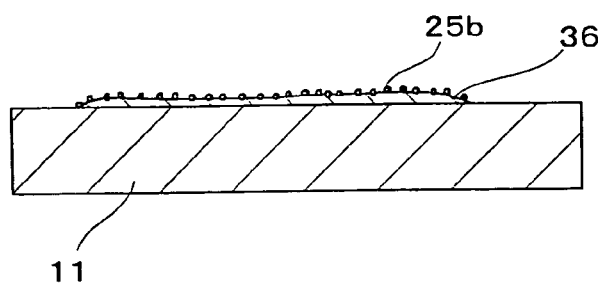
FIG. 6C is a sectional view schematically showing a step of forming the conductor pattern.

Subsequently, by heating by the fixing device 22, the metal-containing resin particles 25 are melted to form a film and adhered to the substrate to form a metal-containing resin layer 36 as shown in FIG. 6C. The heating temperature is determined to be somewhat higher, for example, about 20° C., than the melting point or glass-transition temperature when the thermoplastic resin is used.

Where the thermosetting resin is used, particles are produced in a B stage where it is in an inadequately cured but meltable state. Thus, the metal-containing resin particles 25 are melted to form a film and adhered to the substrate by the heating step in the same manner as the thermoplastic resin. For example, when an epoxy resin is used as the thermosetting resin to conduct an experiment, a good film and adhesion to the substrate can be obtained at a glass-transition temperature. Besides, when the thermosetting resin is used, curing of the resin may be completed by the fixing device 22 or it may be cured after completing all the steps.

Then, the surface resin is partly removed by the etching device 23 to reveal partly the fine metal particles 25b, which are contained in the metal-containing resin layer 36, on the surface.

Figure 6D:
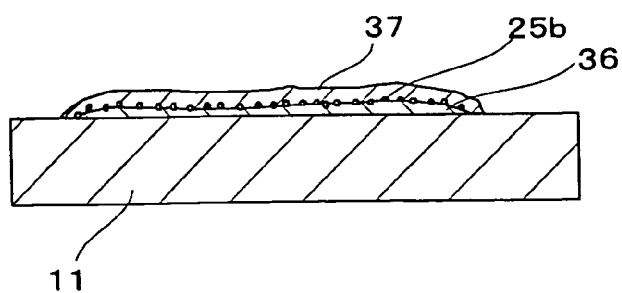
FIG. 6D is a sectional view schematically showing a step of forming the conductor pattern.

Subsequently, the fine metal particles 25b serve as the plating catalyst in the plating device 24 to deposit the conductor metal layer 37 on the metal-containing resin layer 36 by plating, and the conductor pattern of FIG. 6D can be obtained. The plating treatment by the plating device 24 may be made by either electroless plating or electrolytic plating or both of them.

According to the first embodiment, the conductor pattern containing conductive fine metal particles is formed, the treatment to partly protrude the fine metal particles on the surface of the metal-containing resin layer is performed by the etching device, and the plating treatment can be conducted with the protruded fine metal particles used as the plating nuclei. Thus, the fine metal particles have a catalytic action for the progress of the plating reaction, so that the conductor metal layer can be formed in a desirable state on the surface of the metal-containing resin layer.

The wiring board can be formed without using an exposure mask, and its production cost can be reduced.

Besides, the wiring board can be formed through a small number of steps, so that highly reliable electronic parts can be produced with high yield at a low cost.

Second Embodiment

Figure 7:
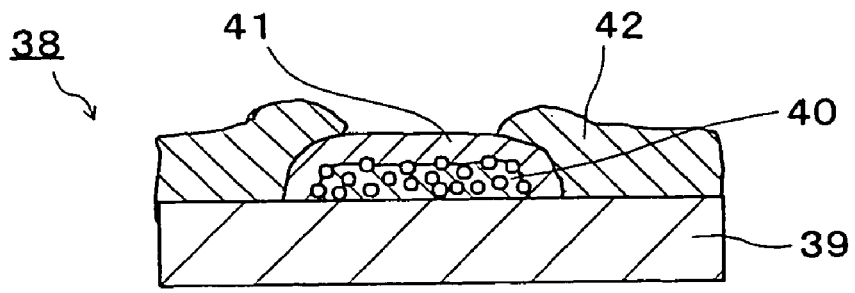
FIG. 7 is a sectional view schematically showing the wiring board according to a second embodiment of the present invention.
Figure 8:
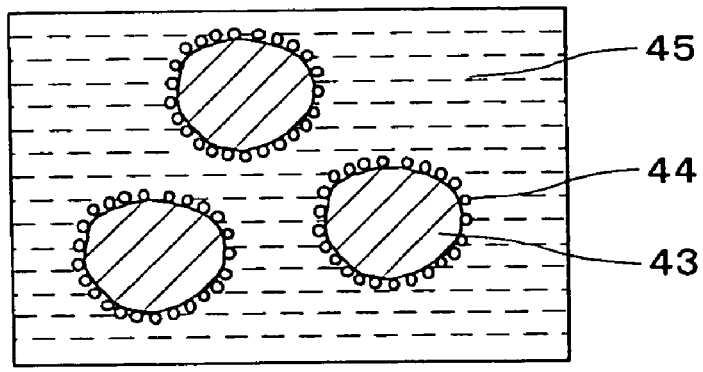
FIG. 8 is a sectional view schematically showing an example structure of a solution in which resin particles are dispersed.

FIG. 7 shows schematically a cross section of a wiring board 38 according to a second embodiment of the present invention. FIG. 8 is a view schematically showing a cross section of a solution to be used in a printing step of selectively transferring resin particles 43 to a substrate.

The wiring board 38 is comprised of a substrate 39, a nonconductive metal-containing resin layer 40 which is selectively formed on the substrate 39, a conductive metal layer 41 which is formed on the metal-containing resin layer 40 with fine metal particles interposed between them and an insulating resin layer 42.

The metal-containing resin layer 40 and the conductor metal layer 41 of the wiring board 38 according to the second embodiment are formed according to the method described in the first embodiment.

The insulating resin layer 42 which partly covers the conductor metal layer 41 can be formed into a desired pattern in the same manner by the production device and production process shown in FIG. 2. The resin layer 42 can be formed without requiring the etching device 23 and the plating device 24.

For the solution supplied by the resin/solution supply device 16, a solution which has the resin particles 43 dispersed into a solvent 45 as shown in FIG. 8 is used. A surface active agent 44 may be added to the solution as required in order to enhance dispersibility. For the solvent 45, the same material as one used for the solvent used in the first embodiment is used, and as the material for the resin particles 43, the thermosetting resin or the thermoplastic resin used in the first embodiment is used. And, properties that the resin particles and the solvent are required to possess in view of the production device and the production process are substantially the same as those in the first embodiment.

There is a case where the insulating resin layer 42 is required to have a thickness of a prescribed value or more because its insulating properties are important. In such a case, the resin particles 43 are caused to increase the particle diameter, the content of the resin particles 43 in the solution is increased, or the forming step of the resin layer 42 is performed plural times. For example, if the resin particles 43 have a particle diameter of 2 μm and a content of 60 wt %, a resin layer having a thickness of 20 μm could be obtained by performing the forming steps of the resin layer 42 four times.

According to the second embodiment, the conductor metal layer is covered with the insulating resin, so that a highly reliable wiring board having high tolerance to environment, especially electromigration characteristics and chemical resistance, or high resistance to mechanical damage and abrasion can be obtained in addition to the effects in the first embodiment.

Third Embodiment

Figure 9:
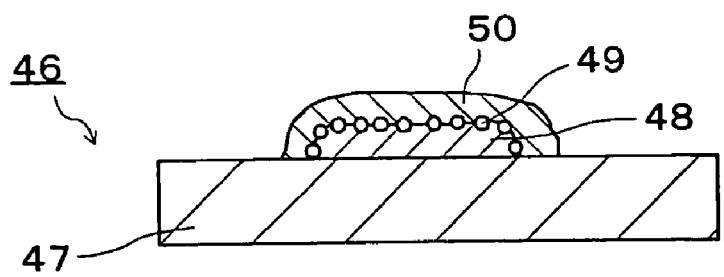
FIG. 9 is a sectional view schematically showing the wiring board according to a third embodiment of the present invention.
Figure 10:
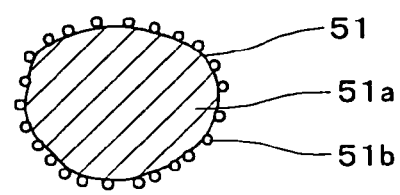
FIG. 10 is a sectional view schematically showing an example structure of a resin particle with metal adhered to its surface.

FIG. 9 shows schematically a cross section of a wiring board 46 according to a third embodiment of the present invention. FIG. 10 shows schematically a cross section of a resin particle with fine metal particles 51b adhered to its surface.

The wiring board 46 is comprised of a substrate 47, a resin layer 48 which is selectively formed on the substrate 47, fine metal particles 49 adhered to the resin layer 48 and a conductive metal layer 50 which is formed on the resin layer 48 with the fine metal particles 49 interposed between them.

In the third embodiment, the resin layer 48 of the wiring board 46 and the conductor metal layer 50 which is formed on the resin layer 48 with the fine metal particles 49 interposed between them are formed by the production device shown in FIG. 2. The resin particles in the solution to be supplied from the resin/solution supply device 16 when the conductor pattern is formed have a structure different from that in the first embodiment, and metal-adhered resin particles 51 which have the fine metal particles 51b adhered to the surfaces of resin particles 51a shown in FIG. 10 are used. The fine metal particles 49 which are present between the resin layer 48 and the conductor metal layer 50 correspond with the fine metal particles 51b adhered to the surfaces of the metal-adhered resin particles 51.

The fine metal particles 51b are adequate if they are adhered to or adsorbed by the surfaces of the resin particles 51a. The fine metal particles 51b may be contacted directly to the melted resin particles 51a or a metal complex or metal ion may be adsorbed within the solvent. Here, examples of the metal to be adhered or adsorbed are Pt, Pd, Cu, Au, Ni, Ag and the like.

When the metal complex or the metal ion is adsorbed to the resin surface, it is necessary to dispose a reducing device and to perform a reduction process before the drying step by the drying device 21 of FIG. 2 because the metal complex or the metal ion does not act as plating nucleus.

FIG. 11 and FIG. 12A through FIG. 12C show an embodiment that another printing method is disposed instead of the offset printing section 200 shown in the first through third embodiments.

Figure 11:
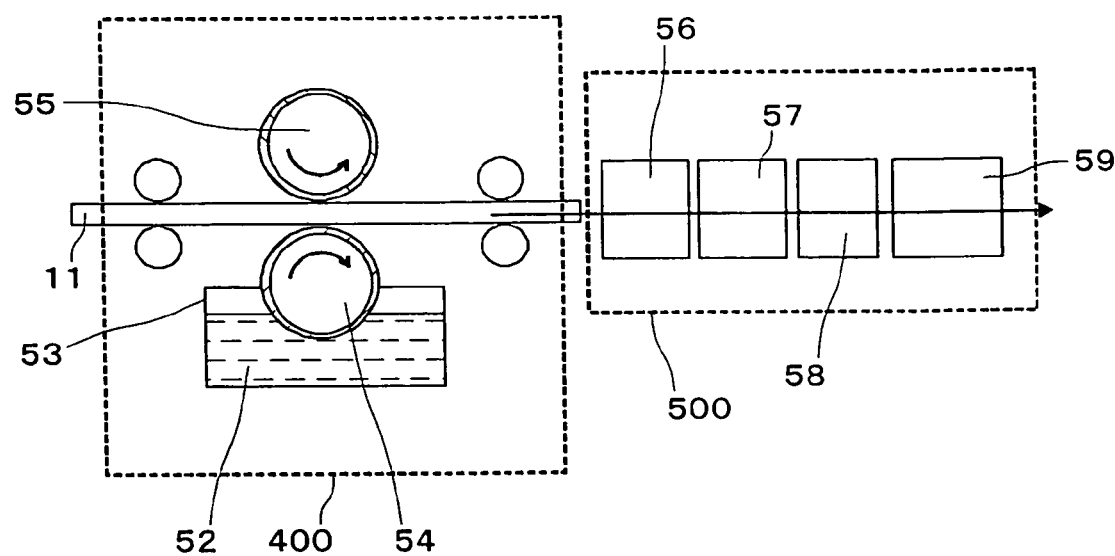
FIG. 11 is a view schematically showing another conductor pattern forming step in one embodiment of the present invention.

In the embodiment shown in FIG. 11, the production device is comprised of a printing section 400 and a post-treating section 500. The printing section 400 is mainly comprised of a resin/solution supply device 53, a plate cylinder 54 and an impression cylinder 55, and the post-treating section 500 is mainly comprised of a drying device 56, a fixing device 57, an etching device 58 and a plating device 59.

In this production device, a resin solution 52 being supplied from the resin/solution supply device 53 within the printing section 400 is directly printed on the substrate 11 by the plate cylinder 54, then processed by the post-treating section 500. In this case, the plate may be a flat plate, an engraved plate or a relief plate. The post-treating section 500 has the same functions as those shown in FIG. 2.

Figure 12A:
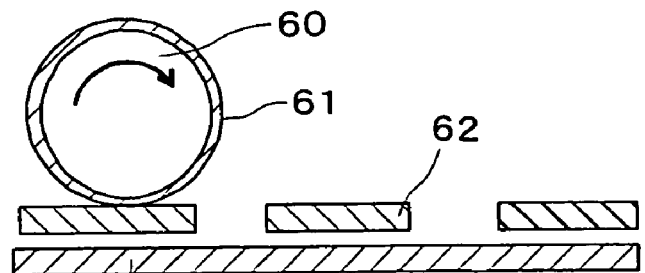
FIG. 12A is a sectional view schematically showing another conductor pattern printing step in one embodiment of the present invention.
Figure 12B:
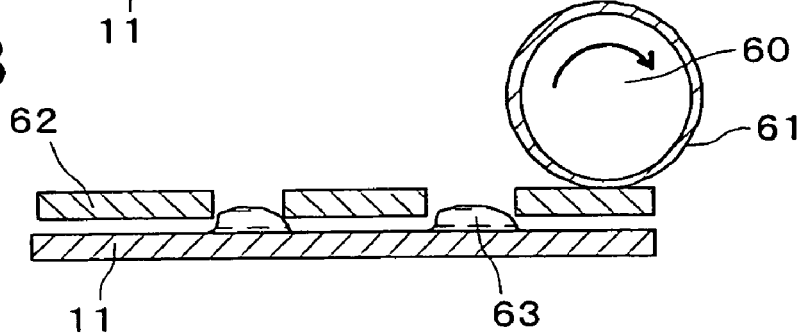
FIG. 12B is a sectional view schematically showing another conductor pattern printing step in one embodiment of the present invention.
Figure 12C:
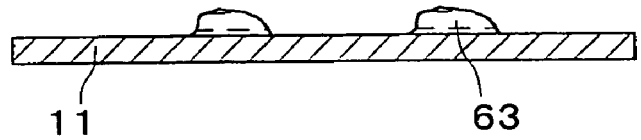
FIG. 12C is a sectional view schematically showing another conductor pattern printing step in one embodiment of the present invention.

FIG. 12A through FIG. 12C show schematically cross sections of production steps according to another printing method different form the printing method of the printing section 400 shown in FIG. 11.

According to the production steps of this printing method, a roller 60 with a solution 61 containing a metal-adhered resin particles adhered to its surface is pressed to and rolled to move along the surface of a stencil 62 provided with prescribed holes as shown in FIG. 12A.

Thus, a solution 63 containing a metal-adhered resin particles is transferred to the substrate 11 to form a desired pattern as shown in FIG. 12B and FIG. 12C. The step by the post-treating section is same as that by the post-treating section 500 of the production device shown in FIG. 11.

According to the third embodiment, the resin particles contained in the solution supplied from the resin/solution supply device 16 can be formed of the metal-adhered resin particles which have fine metal particles adhered to their surfaces. Thus, adhesiveness with the substrate can be improved without increasing the thickness of the resin layer because no metal is contained in the resin below the conductor metal layer. Therefore, a thinner and lighter wiring board can be obtained.

Fourth Embodiment

Figure 13:
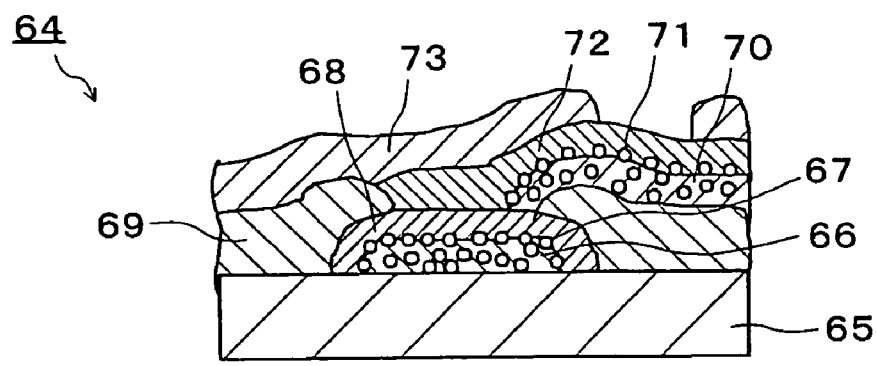
FIG. 13 is a sectional view schematically showing the wiring board according to a fourth embodiment of the present invention.

FIG. 13 shows schematically a cross section of a multilayer wiring board 64 according to a fourth embodiment of the present invention.

The multilayer wiring board 64 is comprised of a substrate 65, a first metal-containing resin layer 66 which is selectively formed on the substrate 65 and contains fine metal particles 67, a first conductor metal layer 68 which is formed on the first metal-containing resin layer 66 with the fine metal particles 67 interposed between them, a first resin layer 69 which is selectively formed to partly cover the first conductor metal layer 68, a second metal-containing resin layer 70 which is selectively formed on part of the first conductor metal layer 68 and on the first resin layer 69 and contains fine metal particles 71, a second conductor metal layer 72 which is formed on part of the first conductor metal layer 68 and on the second metal-containing resin layer 70 with the fine metal particles 71 interposed partly between them, and a second resin layer 73 which is selectively formed on the first resin layer 69 and the second conductor metal layer 72.

Then, as to a production method of the multilayer wiring board 64, steps will be described briefly with reference to FIG. 14A through FIG. 14D. FIG. 14A through FIG. 14D show schematically cross sections of the forming steps of the multilayer wiring board 64.

Figure 14A:
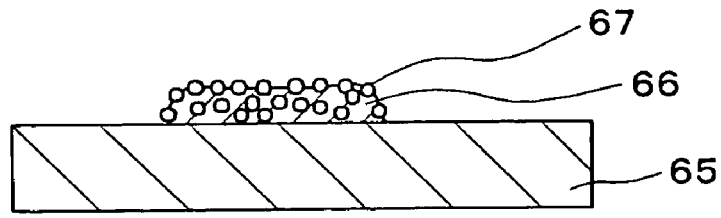
FIG. 14A is a sectional view schematically showing a step of forming a multilayer wiring board according to the fourth embodiment.

As shown in FIG. 14A, a desired wiring pattern containing the fine metal particles 67 is formed by the printing section of the production device shown in FIG. 2, FIG. 11, and FIG. 12A through FIG. 12C. This step selectively forms the first metal-containing resin layer 66 containing the fine metal particles 67 on the substrate 65.

Figure 14B:
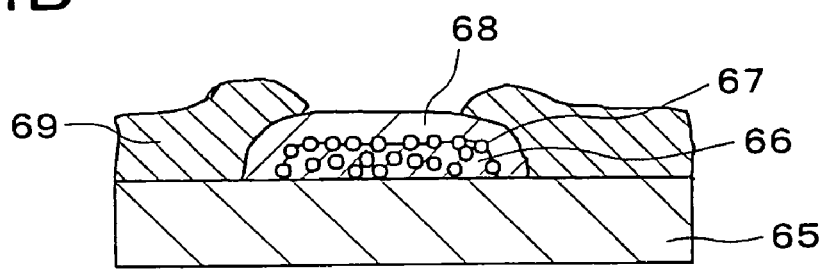
FIG. 14B is a sectional view schematically showing a step of forming the multilayer wiring board according to the fourth embodiment.

Subsequently, the first conductor metal layer 68 is formed on the first metal-containing resin layer 66 with the fine metal particles 67 interposed between them, and the insulating first resin layer 69 is selectively formed on the substrate 65 and the first conductor metal layer 68 as described in the second embodiment shown in FIG. 14B.

Figure 14C:
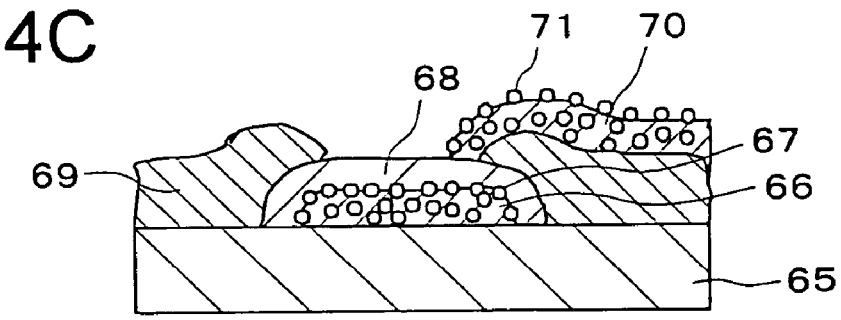
FIG. 14C is a sectional view schematically showing a step of forming the multilayer wiring board according to the fourth embodiment.
Figure 14D:
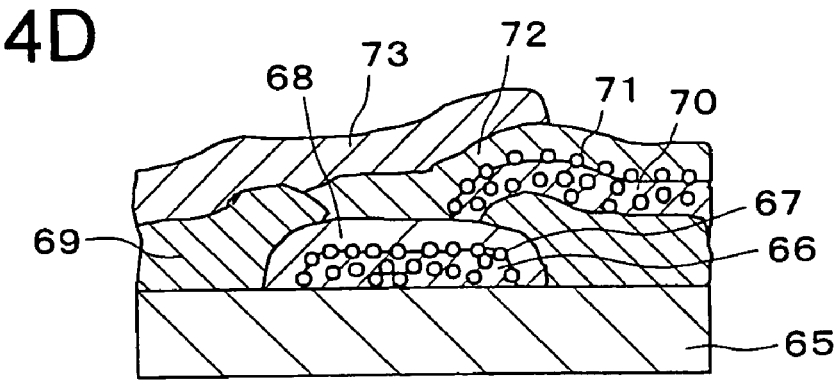
FIG. 14D is a sectional view schematically showing a step of forming the multilayer wiring board according to the fourth embodiment.

FIG. 14C and FIG. 14D show the repetition of the steps, and the second metal-containing resin layer 70, the second conductor metal layer 72 and the second resin layer 73 are formed. The second conductor metal layer 72 can be formed by electroless plating, and the fine metal particles 71 and the first conductor metal layer 68 act as the plating catalysts to deposit the second conductor metal layer 72 in the shape as shown in FIG. 14D.

In FIG. 14D, the second metal-containing resin layer 70 containing the fine metal particles 71 is in contact with the first conductor metal layer 68, and it is adequate if the second conductor metal layer 72 is connected to the first conductor metal layer 68 in the plating step, and the second metal-containing resin layer 70 and the first conductor metal layer 68 are not required to be contacted with each other but adequate if they are close to each other.

Here, the multilayer wiring board provided with the metal-containing resin layer which is formed of the metal-containing resin particles containing the fine metal particles in the dispersed form, but the metal-adhered resin particles 51 shown in FIG. 10 may be used to form the metal-containing resin layer.

According to the fourth embodiment, the multilayer wiring board can be produced by a simple process without requiring the complex steps using the exposure mask described above, and wiring boards which can be produced in various types and small quantity at a low cost can be provided.

The embodiments of the present invention are not limited to the above description but can be expanded or modified within the scope of technical idea of the present invention, and the expanded and/or modified embodiments are also included in the technical scope of the present invention.

What is claimed is:

1. A method of producing a wiring board, comprising:
   selectively arranging resin particles, which have a resin as a main component and have fine metal particles with a particle diameter of 0.01 to 10 μm contained or adhered to their surfaces, on one main surface of a substrate;
   fixing the resin particles to one main surface of the substrate; and
   conducting electroless plating or electrolytic plating for the fixed resin layer by using the fine metal particles as plating nuclei so that a conductor metal layer can be formed to conform to a configuration of the fixed resin layer.

2. A method of producing a wiring board according to claim 1, wherein the fine metal particles adhered to the surface of the resin layer are adhered to the surface of the resin layer by either adsorption of a metal complex or metal ion or direct adhesion of the fine metal particles.

3. A method of producing a wiring board according to claim 1, further comprising a reducing step for reducing the adsorbed fine metal particles prior to the metal plating step when the resin particles which have the fine metal particles adhered to the surfaces of the particles by adsorption of a metal complex or metal ion are used.

4. A method of producing a wiring board according to claim 1, further comprising an etching step for protruding at least the fine metal particles in part by an etching treatment prior to the metal plating step when the resin particles containing the fine metal particles are used.

5. A method of producing a wiring board according to claim 1, wherein the resin particles are disposed on the substrate in the arranging step by a method selected from offset printing, relief printing, engraved printing, stencil printing and surface printing.

6. A method of producing a wiring board according to claim 1, wherein the arranging step is comprised of disposing a solution, which has the resin particles dispersed into a solvent, on the substrate and drying to evaporate the solvent to remain the resin particles on the substrate.

* * * * *